United States Patent
Hieno et al.

(10) Patent No.: US 9,177,818 B2
(45) Date of Patent: Nov. 3, 2015

(54) PATTERN FORMATION METHOD AND BLOCK COPOLYMER

(71) Applicant: Kabushiki Kaisha Toshiba, Minato-ku (JP)

(72) Inventors: Atsushi Hieno, Kanagawa-ken (JP); Hiroko Nakamura, Kanagawa-ken (JP); Koji Asakawa, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 84 days.

(21) Appl. No.: 14/065,944

(22) Filed: Oct. 29, 2013

(65) Prior Publication Data

US 2014/0127910 A1    May 8, 2014

(30) Foreign Application Priority Data

Nov. 7, 2012 (JP) ................................. 2012-245531

(51) Int. Cl.
*H01L 21/311* (2006.01)
*H01L 21/308* (2006.01)

(52) U.S. Cl.
CPC .................................. *H01L 21/3081* (2013.01)

(58) Field of Classification Search
USPC ...................... 430/270.1, 322, 325
See application file for complete search history.

(56) References Cited

U.S. PATENT DOCUMENTS

| | | | |
|---|---|---|---|
| 6,565,763 B1 | 5/2003 | Asakawa et al. | |
| 8,114,306 B2 | 2/2012 | Cheng et al. | |
| 2010/0294740 A1 | 11/2010 | Cheng et al. | |
| 2013/0078570 A1* | 3/2013 | Hieno et al. | 430/270.1 |

FOREIGN PATENT DOCUMENTS

| | | |
|---|---|---|
| JP | 2007-47822 A | 2/2007 |
| WO | WO 2010/133422 A2 | 11/2010 |

OTHER PUBLICATIONS

Joy Y. Cheng, et al., "Simple and Versatile Methods to Integrate Directed Self-Assembly with Optical Lithography Using a Polarity-Switched Photoresist", ACS Nano, vol. 4, No. 8, 2010, 9 pages.
Office Action issued Feb. 16, 2015 in Korean Patent Application No. 10-2013-132756 (with English language translation).

* cited by examiner

*Primary Examiner* — Charles Garber
*Assistant Examiner* — Abdulfattah Mustapha
(74) *Attorney, Agent, or Firm* — Oblon, McClelland, Maier & Neustadt, L.L.P.

(57) ABSTRACT

According to one embodiment, a pattern formation method includes: forming a block copolymer layer containing a polystyrene derivative and an acrylic having 6 or more carbon atoms on a side chain in an opening of a resist layer provided on an underlayer and having the opening; forming a first layer containing the polystyrene derivative and a second layer containing the acrylic in the opening by phase-separating the block copolymer layer; and removing the second layer.

19 Claims, 8 Drawing Sheets

FIG. 7C PS-b-PnHMA

FIG. 7B PS-b-PnBMA

FIG. 7A PS-b-PMMA

PATTERN FORMATION METHOD AND BLOCK COPOLYMER

CROSS-REFERENCE TO RELATED APPLICATIONS

This application is based upon and claims the benefit of priority from Japanese Patent Application No. 2012-245531, filed on Nov. 7, 2012; the entire contents of which are incorporated herein by reference.

FIELD

Embodiments described herein relate generally to a pattern formation method and block copolymer.

BACKGROUND

Fine patterns in various electronic devices such as semiconductor devices are formed by, for example, lithography technology. As a new lithography technology for coping with future miniaturization of patterns, there is a method in which a block copolymer in which multiple kinds of polymers are bonded is microphase-separated and the resulting matter is used to perform processing. In this method, it is important to microphase-separate the block copolymer with a desired orientation in a desired position. Furthermore, it is desired to form fine patterns at lower cost by reducing the number of processes or the like.

BRIEF DESCRIPTION OF THE DRAWINGS

FIG. 7A to FIG. 7F are AFM images illustrating phase separations in the pattern formation method according to the embodiment.

DETAILED DESCRIPTION

Figure 1A:
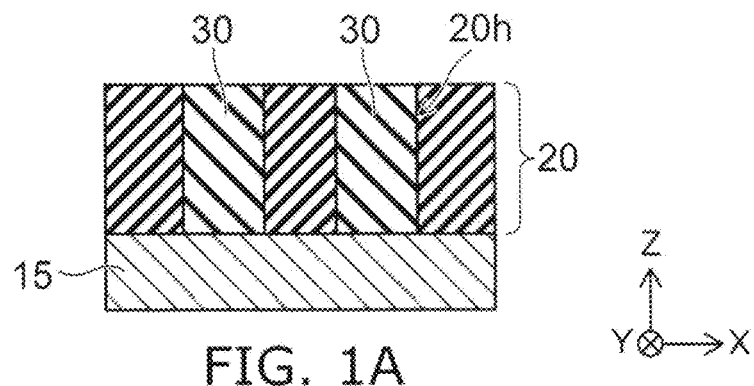
FIG. 1A to FIG. 1C are schematic cross-sectional views illustrating a pattern formation method according to an embodiment.

According to one embodiment, a pattern formation method includes: forming a block copolymer layer containing a polystyrene derivative and an acrylic having 6 or more carbon atoms on a side chain in an opening of a resist layer provided on an underlayer and having the opening; forming a first layer containing the polystyrene derivative and a second layer containing the acrylic in the opening by phase-separating the block copolymer layer; and removing the second layer.

Hereinbelow, embodiments of the invention are described with reference to the drawings.

The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

Figure 1B:
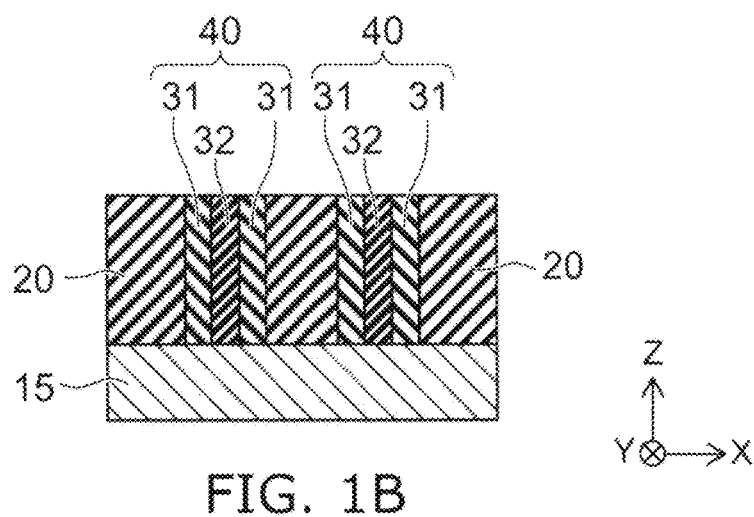
Figure 1C:
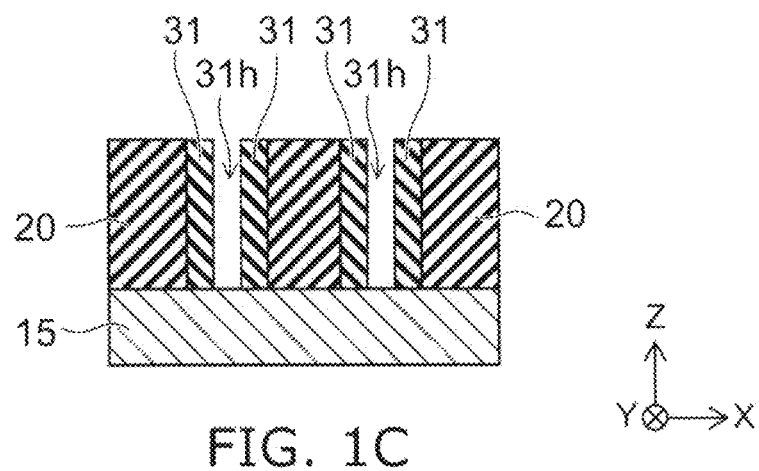

FIG. 1A to FIG. 1C are schematic cross-sectional views illustrating a pattern formation method according to an embodiment.

Figure 2A:
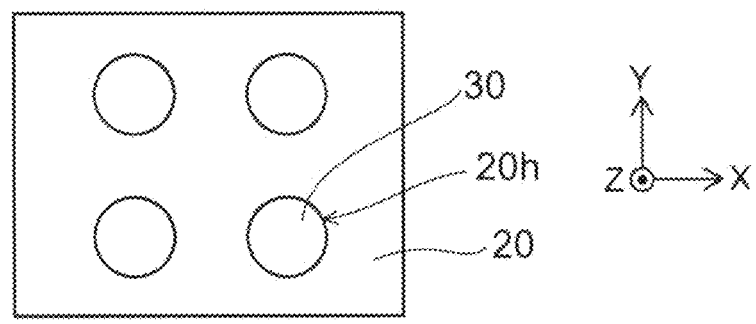
FIG. 2A to FIG. 2C are schematic plan views illustrating the pattern formation method according to the embodiment.
Figure 2B:
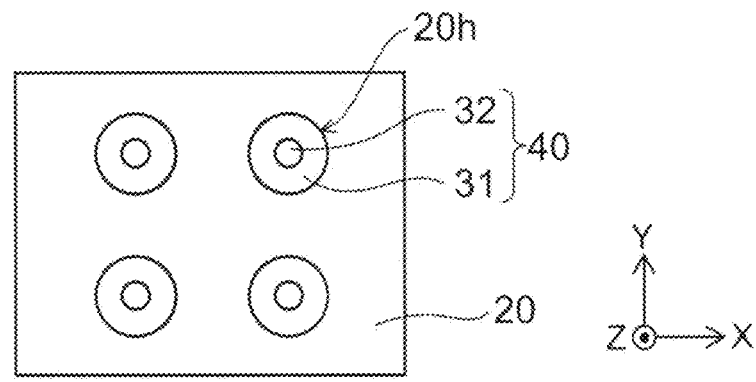
Figure 2C:
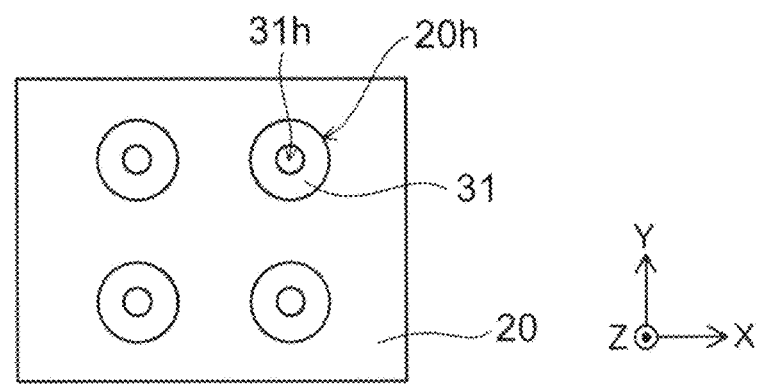

FIG. 2A to FIG. 2C are schematic plan views illustrating the pattern formation method according to the embodiment.

In the drawings, the direction perpendicular to the major surface of an underlayer 15 is taken as the Z-axis direction. One direction perpendicular to the Z-axis direction is taken as the X-axis direction. The direction perpendicular to the Z-axis direction and the X-axis direction is taken as the Y-axis direction.

As shown in FIG. 1A, the pattern formation method according to the embodiment includes forming a block copolymer layer 30 in an opening 20h of a resist layer 20 provided on an underlayer 15 and having the opening 20h (a first step). The underlayer 15 is a Si substrate, for example. The opening 20h is a hole, for example. The opening 20h may be a recess. The block copolymer layer 30 contains a polystyrene derivative and an acrylic having 6 or more carbon atoms on the side chain.

As shown in FIG. 2A, in this example, the opening 20h of the resist layer 20 has a circular form, and is periodically arranged in the X direction and the Y direction. However, the planar shape of the opening 20h is not limited to circular.

The pattern formation method further includes phase-separating the block copolymer layer 30 to form a first layer 31 containing the polystyrene derivative and a second layer 32 containing the acrylic in the opening 20h (a second step).

It is assumed that the block copolymer contains two kinds of polymers A and B and the surface energy of the polymer A is smaller. In the case where the surface energy of the resist layer 20 is nearer to the surface energy of the polymer A than to the surface energy of the polymer B, the affinity between the polymer A and the resist layer 20 is higher and the polymer A is likely to gather at the side wall of the resist layer 20. On the other hand, in the case where the surface energy of the resist layer 20 is nearer to the surface energy of the polymer B than to the surface energy of the polymer A, the affinity between the polymer B and the resist layer 20 is higher and the polymer B is likely to gather at the side wall of the resist layer 20.

Before the block copolymer layer 30 is formed, the resist layer 20 having the opening 20h is formed. After the opening 20h is formed, the resist layer 20 is cross-linked, and the resist layer 20 after cross-linking is insolubilized in the solvent that dissolves the block copolymer. As the solvent that dissolves the block copolymer, aromatic hydrocarbons such as toluene, xylene, and mesitylene, ketones such as cyclohexanone, acetone, ethyl methyl ketone, and methyl isobutyl ketone, and Cellosolves™ such as methyl Cellosolve™, methyl Cellosolve™ acetate, ethyl Cellosolve™ acetate, and butyl Cellosolve™ acetate are given. In addition, a good solvent such as tetrahydrofuran and chloroform is given. Two or more kinds of solvents may be used in combination as necessary.

As shown in FIG. 1B, the block copolymer layer 30 is microphase-separated by annealing to form the first layer 31 containing a polystyrene derivative and the second layer 32 containing an acrylic in the opening 20h. In this example, a pattern of a cylinder structure 40 is formed. The cylinder structure 40 includes the first layer 31 and the second layer 32. In the embodiment, the method and the atmosphere for annealing the block copolymer are not particularly limited. For example, the microphase separation of the block copolymer is performed by heating in a forming gas in which a gas having a reducing action such as hydrogen is mixed in an inert gas. Other than this, the atmosphere for annealing may be a vacuum and an inert gas such as argon and nitrogen. The annealing apparatus is not particularly limited, and an oven, a hot plate, or the like is preferably used.

As an annealing method other than heating, a solvent annealing method may be used in which the block copolymer is exposed in a solvent vapor atmosphere to form a microphase separation structure. As the solvent used for solvent annealing, aromatic hydrocarbons such as toluene, xylene, and mesitylene, ketones such as cyclohexanone, acetone, ethyl methyl ketone, and methyl isobutyl ketone, and Cellosolves™ such as methyl Cellosolve™, methyl Cellosolve™ acetate, ethyl Cellosolve™ acetate, and butyl Cellosolve™ acetate are given. In addition, a good solvent such as tetrahydrofuran and chloroform may be used. Two or more kinds of solvents may be used in combination as necessary.

When the affinity between one of the polymers contained in the block copolymer layer 30 and the resist layer 20 is higher than that of the other polymer, the one polymer out of the polymers included in the block copolymer is likely to gather at the side wall of the resist layer 20.

The affinity of the first layer 31 to the resist layer 20 is higher than the affinity of the second layer 32 to the resist layer 20.

Therefore, as shown in FIG. 2B, the cylinder structure 40 including the first layer 31 in contact with the resist layer 20 and the second layer 32 surrounded by the first layer 31 is formed. The first layer 31 has a circular cylindrical form and the second layer 32 has a circular columnar form.

The pattern formation method further includes removing the second layer 32 from the opening 20h of the resist layer 20 (a third step).

As shown in FIG. 1C, the second layer 32 is removed in the opening 20h of the resist layer 20 by etching. Here, the etching resistance of the second layer 32 is lower than the etching resistance of the first layer 31. Therefore, the second layer 32 is selectively removed from the opening 20h. As the method for removing one polymer after microphase separation (herein, the method for removing the layer 32), reactive ion etching (RIE) and wet etching are given. By RIE, the one polymer can be removed by utilizing the characteristic that the polymer A and the polymer B composing the block copolymer have different RIE resistances.

For example, when a block copolymer composed of polystyrene and polybutadiene is microphase-separated, only the polystyrene block can be left by ozone treatment. When a block copolymer composed of polystyrene and poly(methyl methacrylate) is microphase-separated, only the polystyrene block can be left by RIE using a reactive gas such as oxygen and a carbon halogenated (see U.S. Pat. No. 6,565,763 and K. Asakawa et al., *Jpn. J. Appl. Phys.*, 41, 6112-6118, 2002). The gas used for RIE is not particularly limited. Oxygen, a halogen-based gas containing fluorine, chlorine, bromine, or iodine, and a carbon halogenated may be used.

On the other hand, in the case of wet etching, a block copolymer including a polymer A decomposable by energy line irradiation and a polymer B hardly decomposable by an energy line is microphase-separated, and then the block copolymer layer is irradiated with light or an electron beam to decompose the polymer A and the polymer A is washed away using a solvent. Thereby, the polymer A can be selectively removed. As the energy line, ultraviolet light, an electron beam, X-rays, and the like are given, for example. As the solvent, aromatic hydrocarbons such as toluene, xylene, and mesitylene, cycloalkanes such as cyclohexane, cycloheptane, cyclooctane, and cyclononane, alkanes such as hexane, heptane, octane, nonane, and decane, alkyl alcohols such as methanol, ethanol, 1-propanol, and 2-propanol, and the like are given.

In addition, an organic solvent such as ketones, Cellosolves™, and esters may be used. As the solvent of ketones, cyclohexanone, acetone, ethyl methyl ketone, methyl isobutyl ketone, and the like are given. As the solvent of Cellosolves™, methyl Cellosolve™, methyl Cellosolve™ acetate, ethyl Cellosolve™ acetate, butyl Cellosolve™ acetate, and the like are given. As the solvent of esters, ethyl acetate, butyl acetate, isoamyl acetate, γ-butyrolactone, methyl 3-methoxypropionate, and the like are given. Two or more kinds of solvents may be used in combination as necessary.

As shown in FIG. 2C, after the second layer 32 is removed from the opening 20h, the first layer 31 in a circular cylindrical form remains in the opening 20h. Thereby, an opening 31h having a smaller diameter than the inner diameter of the opening 20h is formed.

Examples of the phase separation of the block copolymer layer will now be described.

A block copolymer includes structures (blocks) in each of which the same kind of monomer is continuously bonded in plural, for example. The blocks are chemically bonded to one another. In the block copolymer, a plurality of kinds of polymers in a block form are chemically bonded to one another. A fine periodic pattern is formed by microphase separation using the repulsive force between polymers. The morphology (form) of the block copolymer phase separation structure is determined by the volume fraction of the block. The morphology includes a cylinder structure, a lamella structure, etc., for example.

For example, in the case of a block copolymer composed of two kinds of polymers (a polymer A and a polymer B), the volume fraction of one polymer is approximately 30% in the cylinder structure. In the lamella structure, the volume fractions of the two polymers are approximately 50%. In the cylinder structure, the polymer of the lower ratio has a circular columnar form, and circular columns are periodically aligned. The polymer of the higher volume fraction forms a matrix phase around them. On the other hand, in the lamella structure, layers are alternately formed, and the polymer A and the polymer B are alternately aligned like a polymer A, a polymer B, a polymer A, a polymer B, . . . .

When only microphase separation is performed, a fingerprint-like pattern, various domains, etc. are formed. In this case, it is difficult to form a regular pattern. The regular pattern includes a contact hole (C/H) pattern, a line-and-space (L & S) pattern, etc. necessary for a pattern of a semiconductor, for example. Furthermore, when only microphase separation is performed, also it cannot be predetermined which polymers are arranged in a desired position. A guide pattern for regularly arranging a specific polymer of the block copolymer in a desired position is provided. Thereby, a regular pattern can be formed, and the positions of polymers can be predetermined. Examples of the guide pattern include a physical guide and a chemical guide.

A physical guide according to the embodiment will now be described. The physical guide is a concavo-convex structure body for regularly orienting the block copolymer. The affinity between the side wall in the trench of the structure body and a polymer is utilized. In the case where the affinity between the side wall of the structure body and one polymer is high, the one polymer is aligned on the side wall. Starting from this, the block copolymer is regularly arranged in the trench. The orientation of the block copolymer can be further controlled by forming an orientation control layer also on the bottom surface of the structure body, for example. In the embodiment, a physical guide is provided.

In the case of forming the cylinder structure 40, the first layer 31 and the second layer 32 are oriented using the physical guide in such a manner that the axis of the cylinder is perpendicular to the layer surface of the underlayer 15. When the first layer 31 forms a cylinder and the second layer 32 surrounds the first layer 31, the axis of the first layer 31 forms a perpendicular to the layer surface of the underlayer 15, for example. Conversely, when the second layer 32 forms a cylinder and the first layer 31 surrounds the second layer 32, the axis of the second layer 32 forms a perpendicular to the layer surface of the underlayer 15, for example. Thereby, the block copolymer can be microphase-separated with a desired orientation in a desired position.

In the embodiment, the underlayer 15 is a Si substrate, for example. However, a circuit substrate is used in the actual semiconductor element fabrication. In order to process the circuit substrate, the underlayer 15 includes a resist, a reflection prevention film, a transfer film, etc. The embodiment relates to lithography technology that forms a pattern of a semiconductor, for example. The embodiment is used particularly for patterning technology in which a block copolymer is microphase-separated and then one polymer phase is removed to use the remaining polymer phase as an etching mask, for example.

In a lamella structure or a cylinder structure after microphase separation, a C/H pattern or an L & S pattern can be formed by selectively removing one polymer included in the block copolymer. The cylinder structure having a circular columnar axis perpendicular to the substrate surface forms a C/H pattern by removing the polymer phase forming the circular columnar portion. The lamella structure oriented so as to have a polymer interface perpendicularly to the substrate surface forms an L & S pattern by selectively removing one polymer phase. The C/H pattern and the L & S pattern formed of the microphase separation structure of the block copolymer in this way serve as an etching mask that takes the place of the resist pattern.

If a block copolymer including polystyrene (PS) and poly (methyl methacrylate) (PMMA), for example, is used for the opening 20h of the resist layer 20, an appropriate contact hole pattern may not be formed. This is because the resist is hydrophilic and therefore part of the hydrophilic PMMA gathers at the side wall of the resist.

Hence, the following process is investigated in the pattern formation method using the block copolymer including PS and PMMA.

FIG. 3A to FIG. 3D are schematic cross-sectional views illustrating a pattern formation method according to a reference example.

Figure 3A:
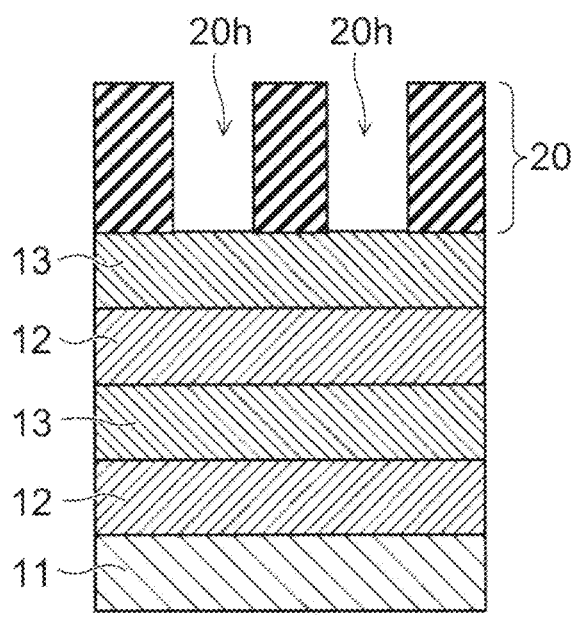
FIG. 3A to FIG. 3D are schematic cross-sectional views illustrating a pattern formation method according to a reference example.

As shown in FIG. 3A, a C film 12 is provided on a film to be processed 11, and a Si oxide film 13 is provided on the C film 12. Further, a C film 12 is provided on the Si oxide film 13, and a Si oxide film 13 is provided on this C film 12. In other words, two sets of the C film 12 and the Si oxide film 13 are prepared. The resist layer 20 is formed on the uppermost Si oxide film 13. The opening 20h described above is provided in the resist layer 20. The Si oxide film 13 exposed from the resist layer 20 and the C film 12 under the Si oxide film 13 exposed from the resist layer 20 are removed by RIE.

Figure 3C:
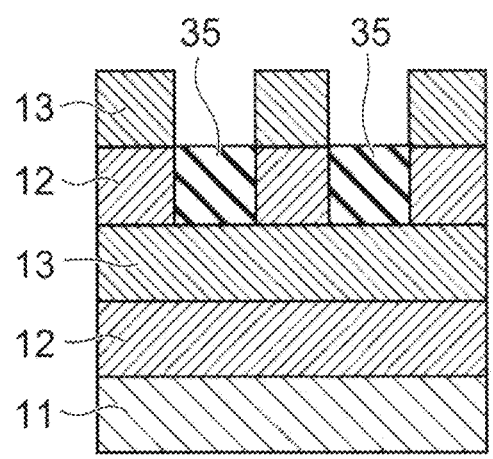
Figure 3B:
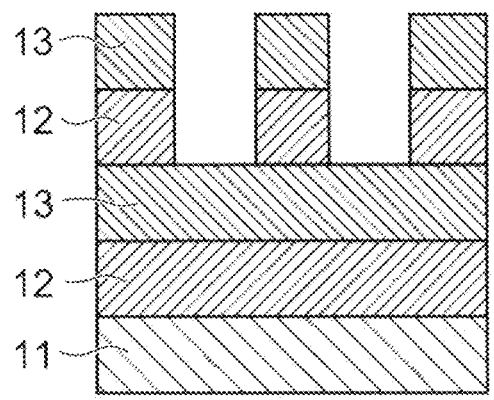

Thereby, as shown in FIG. 3B, the resist pattern is transferred to the Si oxide film 13, and the Si oxide film pattern is transferred to the C film 12. An opening 12h is formed in the C film 12. In this stage, the resist layer 20 has already been removed.

Next, as shown in FIG. 3C, a block copolymer layer 35 containing polystyrene (PS) and poly(methyl methacrylate) (PMMA) is formed in the opening 12h of the C film 12.

Figure 3D:
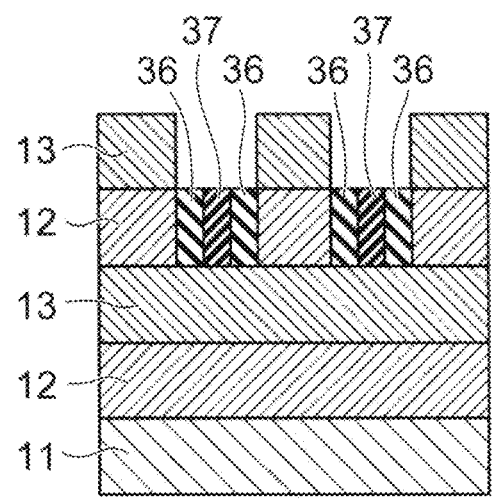

Next, as shown in FIG. 3D, heating treatment (e.g. near 250° C.) is performed on the block copolymer layer 35. By the heating treatment, the block copolymer layer 35 is microphase-separated to form a layer 36 containing polystyrene and a layer 37 containing poly(methyl methacrylate) in the opening 12h. Here, the affinity of polystyrene to the C film 12 is higher than the affinity of poly(methyl methacrylate) to the C film 12. Therefore, the layer 36 in contact with the resist layer 20 and the layer 37 surrounded by the layer 36 are formed. The layer 36 and the layer 37 have a cylinder structure.

In the processes illustrated in FIG. 3A to FIG. 3D, two sets of the Si oxide film 13 and the C film 12 are needed. Thereby, costs are increased. Furthermore, since heating treatment is performed near 250° C. in order to obtain a cylinder structure, costs are increased also in the annealing process.

In other words, in order to form a C/H pattern at low cost, it is effective to reduce the number of manufacturing processes of the Si oxide film 13 and the C film 12 and reduce the temperature in heating treatment. However, under the present conditions, there is no method achieving both and it is necessary to pass through processes like the reference example; thus, costs are increased.

FIG. 4A to FIG. 4F are schematic cross-sectional views illustrating the pattern formation according to the embodiment.

FIG. 5A to FIG. 5F are schematic plan views illustrating the pattern formation according to the embodiment.

Figure 4A:
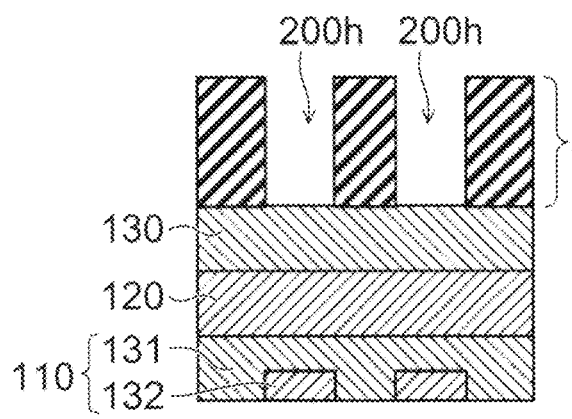
FIG. 4A to FIG. 4F are schematic cross-sectional views illustrating the pattern formation according to the embodiment.

FIG. 4A shows a resist physical guide 200 to which the pattern formation method is applied. The resist physical guide 200 is a resist pattern. A Si oxide film is exposed in an opening (200h) of the resist pattern. The resist pattern edge serves as the starting point of block copolymer arrangement after block copolymer microphase separation.

Since the patterning of the resist physical guide 200 is the same as a common light exposure process, a reflection reduction function is utilized. ArF light is used in the light exposure, for example. Herein, the stacked structure of a Si oxide film 130 (SOG film; spin-on-glass)/a C film 120 (SOC film; spin-on-carbon) has the function of a reflection reduction film. The Si oxide film 130 is an example of a silicon compound film, and the C film 120 is an example of an organic film. The stacked body under the resist physical guide 200 is used as an underlayer.

There is a film to be processed 110 under the C film 120. The film to be processed 110 is formed of a metal interconnection 132 buried in a Si oxide film 131 (TEOS film; tetraethyl orthosilicate), for example. As the material used for the metal interconnection, tungsten, aluminum, copper, copper cobalt, nickel silicide, cobalt silicide, tungsten silicide, and the like are given.

Figure 5A:
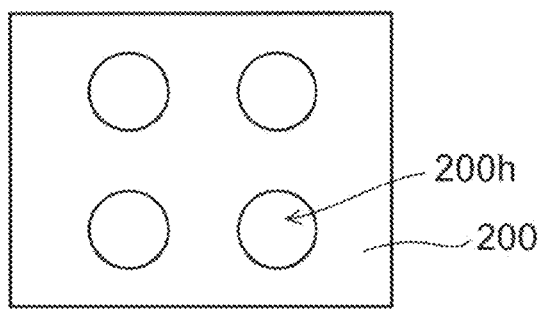
FIG. 5A to FIG. 5F are schematic plan views illustrating the pattern formation according to the embodiment.

As shown in FIG. 5A, the resist physical guide 200 has a C/H pattern. A circular opening 200h is provided in the resist physical guide 200, for example.

Figure 4D:
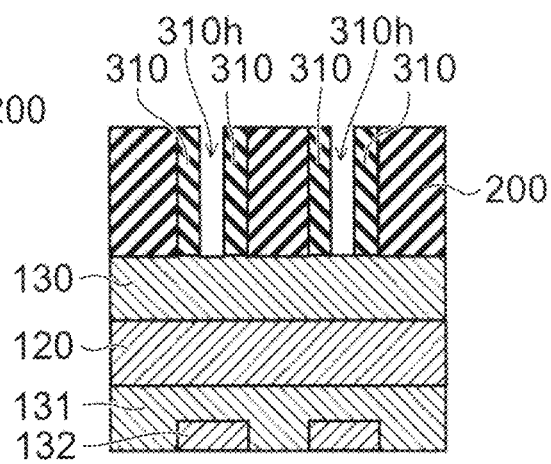
Figure 4B:
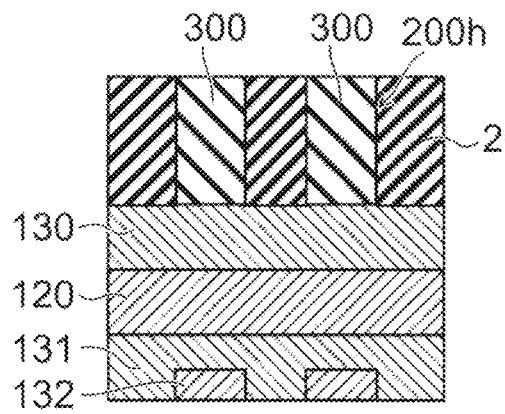

Next, as shown in FIG. 4B, a block copolymer layer 300 containing polystyrene (PS) and poly(n-hexyl methacrylate) (PnHMA) is formed in the opening 200h of the resist physical guide 200.

Figure 5D:
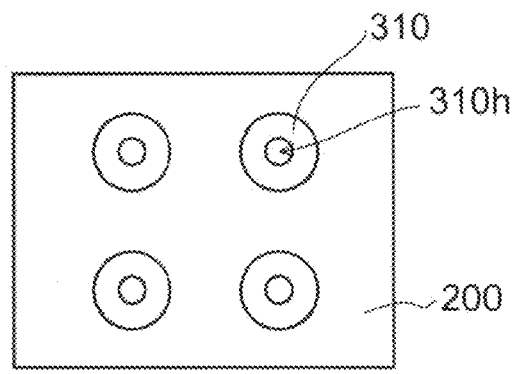
Figure 5B:
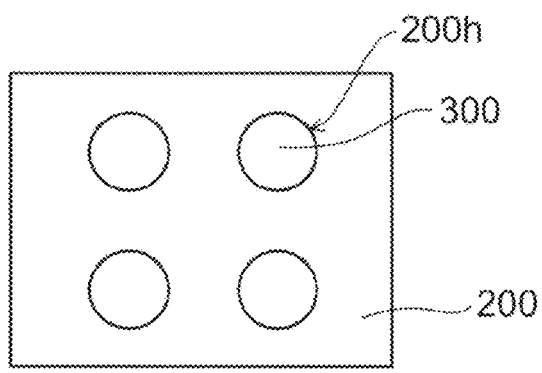

As shown in FIG. 5B, the block copolymer layer 300 formed in the opening 200h is in a state before microphase separation. A block copolymer PS-b-PnHMA with a weight average molecular weight of 70,000 and a molar fraction (f(PS)) of 0.80 is formed in the opening 200h, for example.

Figure 4E:
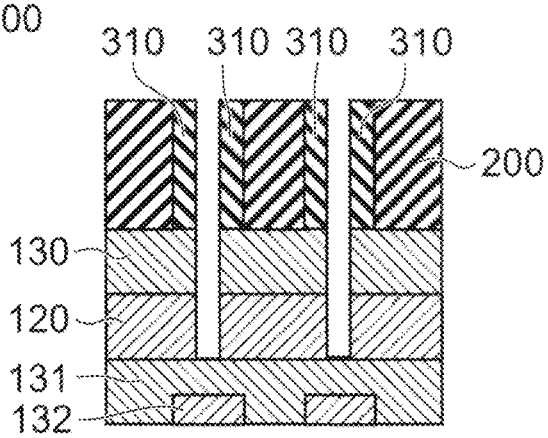
Figure 4C:
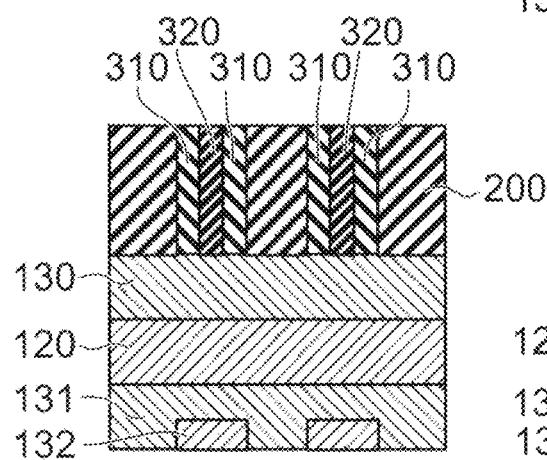

Next, as shown in FIG. 4C, annealing treatment is performed on the block copolymer layer 300. The annealing temperature is adjusted to not less than room temperature (e.g. 25° C.) and not more than 150° C. In a first example, annealing treatment of 150° C. and 8 hours is performed as an example. As described in FIG. 1B, the annealing method and the atmosphere are not particularly limited.

FIG. 4C illustrates a state after microphase separation. In this example, since there is an affinity between the resist physical guide 200 and polystyrene (PS), polystyrene gathers at the side wall of the resist pattern. When the block copolymer layer 300 is microphase-separated, a layer 310 containing polystyrene (PS) and a layer 320 containing poly(n-hexyl methacrylate) (PnHMA) are formed in the opening 200h.

Figure 5E:
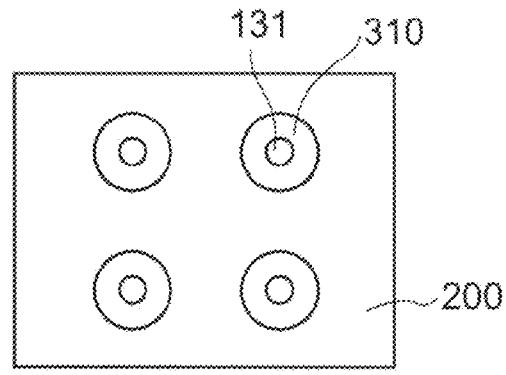
Figure 5C:
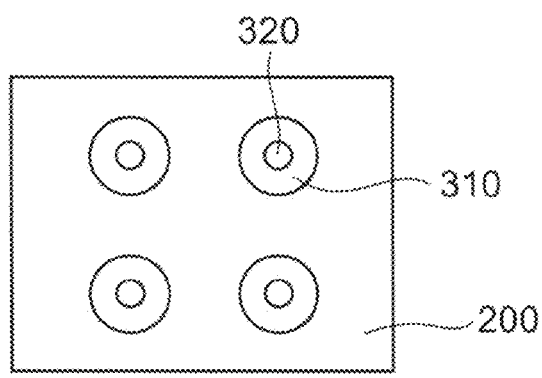

As shown in FIG. 5C, the layer 310 in contact with the resist physical guide 200 and the layer 320 surrounded by the layer 310 are formed. The layer 310 and the layer 320 have a cylinder structure.

Next, as shown in FIG. 4D, the layer 320 is selectively removed by etching. The method for selectively removing the layer 320 is similar to the method for removing the layer 32 of FIG. 1C.

Thus, as shown in FIG. 5D, an opening 310h with a smaller diameter than the opening 200h is formed.

Next, as shown in FIG. 4E and FIG. 5E, the remaining layer 310 and the resist physical guide 200 are used as a mask to perform pattern transfer on the Si oxide film 130 and the C film 120.

For example, the resist physical guide 200 and the layer 310 are used as a mask to etch the Si oxide film 130 using a fluorine-based gas. Subsequently, the Si oxide film pattern is used as a mask to etch the C film 120 using a $CF_4/O_2$/Ar-based gas.

Figure 4F:
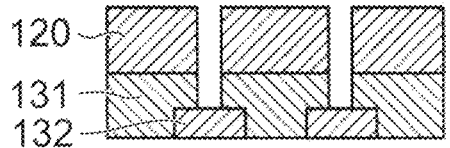
Figure 5F:
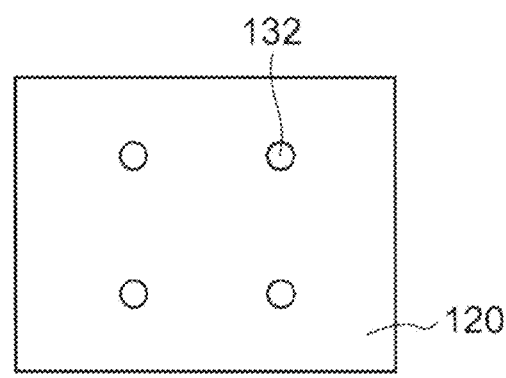

Subsequently, as shown in FIG. 4F and FIG. 5F, the pattern of the C film is used as a mask to etch the Si oxide film 131 using a fluorine-based gas. Finally, the etching reaches the metal interconnection 132.

By transferring the PS pattern to the SOG film, the SOG pattern to the SOC film, and the SOC film pattern to the Si oxide film and the metal interconnection, a sufficient etching selection ratio can be obtained and etching processing is possible even using PS with a thin film thickness.

By the method mentioned above, a guide pattern of a photoresist can be utilized and therefore only one set of an SOG/SOC layer is sufficient. Furthermore, since PS-b-PnHMA can form a phase separation structure in a range of not less than room temperature and not more than 150° C., the annealing temperature can be reduced as compared to PS-b-PMMA. Therefore, the example leads to cost reduction.

In the foregoing, an example in which the resist physical guide 200 is formed by ArF light is illustrated. However, the means for forming the resist physical guide 200 is not limited thereto. Any material whereby a developer-soluble portion and a developer-insoluble portion can be produced by energy line irradiation may be used as the resist physical guide 200. As energy lines other than ArF light, an electron beam, EUV light, an ion beam, and a particle beam may be used.

The reason for selecting a block copolymer of a polystyrene derivative and an acrylic having 6 or more carbon atoms on the side chain will now be described.

First, the reason for selecting an acrylic is described. In order to form an appropriate cylinder structure in a physical guide of a hydrophilic resist, it is necessary to select a block copolymer of PS and a polymer more hydrophobic than PS. This is because when the block copolymer mentioned above is used, the PS of a matrix phase is likely to gather at the side wall of the physical guide of the resist and the polymer more hydrophobic than PS forms a cylinder phase; thus, an appropriate cylinder structure is formed. As the polymer more hydrophobic than PS other than acrylics, polydimethylsiloxane (PDMS) and poly(2,2,2-trifluoroethyl methacrylate) (PTFEMA) are given, for example. However, acrylics are better than PDMS and PTFEMA in the following respects.

The case where PS-b-PDMS is used will now be described. The etching resistance of PDMS to $O_2$ plasma is higher than the etching resistance of PS. Therefore, after RIE, the PS of a matrix phase is removed earlier, and PDMS in a circular columnar form remains; thus, a C/H pattern cannot be formed.

Next, the case where PS-b-PTFEMA is used is described. Since the phase separation of a block copolymer occurs generally at the glass transition temperature or more, phase separation can be produced at lower temperature when the glass transition temperature is lower. The glass transition temperature (Tg) of PnHMA, which is an acrylic, is −27° C., and on the other hand the glass transition temperature (Tg) of PTFEMA is 80° C. Therefore, there is a possibility that PS and PTFEMA cannot be microphase-separated by low temperature annealing at such a level as PS-b-PnHMA.

The advantages in synthetic terms of an acrylic-based polymer are that the monomer serving as the source material is easily available and the polymerization method is simple.

Therefore, an acrylic is selected as the polymer more hydrophobic than PS.

Next, the reason for selecting an acrylic having 6 or more carbon atoms is described.

First, a description is given from the viewpoint of the glass transition temperature. In general, a microphase separation structure is obtained by annealing a block copolymer at the glass transition temperature or more. Hence, when the glass transition temperature is low, the annealing temperature for phase separation can be made low. By increasing the number of carbon atoms of the side chain of the acrylic, the intermolecular force between polymer chains is reduced, and the glass transition temperature can be reduced. The glass transition temperatures of PMMA, PnBMA, and PnHMA that have almost equal molecular weights are 110° C., 39° C., and −27° C., respectively, for example. Therefore, to reduce the annealing temperature for phase separation, the number of carbon atoms of the side chain of the acrylic is preferably larger.

Next, a description is given from the viewpoint of the surface energy.

Figure 6:
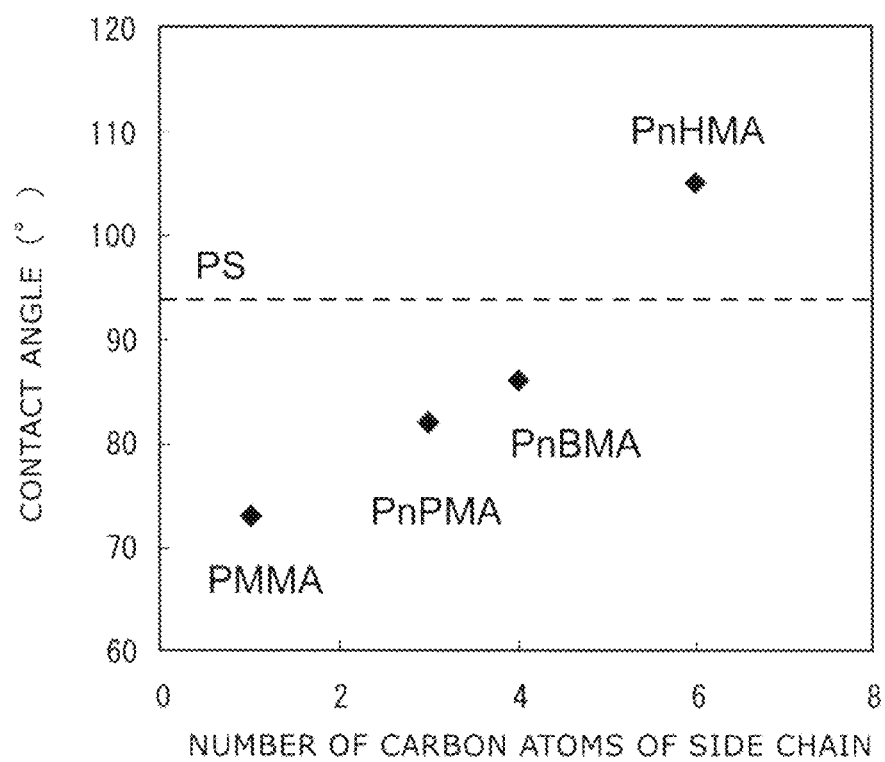
FIG. 6 is a graph showing the contact angle of water for the number of carbon atoms of the side chain of the acrylic.

FIG. 6 is a graph showing the contact angle of water for the number of carbon atoms of the side chain of the acrylic.

FIG. 6 shows the contact angles to water of poly(n-hexyl methacrylate) (PnHMA), polystyrene (PS), poly(n-butyl methacrylate) (PnBMA), poly(n-propyl methacrylate) (PnPMA), and poly(methyl methacrylate) (PMMA). The contact angle of water is used as an indicator of the surface energy. As the contact angle of water increases, the surface energy decreases. On the other hand, as the contact angle of water decreases, the surface energy increases.

PS-b-PnHMA is taken as an example of the block copolymer. PS forms a matrix phase, and PnHMA forms a cylinder phase. When the contact angle of each homopolymer is measured, the contact angle with water is 94 degrees in PS, and 104 degrees in PnHMA. Therefore, PnHMA has a smaller surface energy than PS. In other words, in the case where a cylinder structure of PS-b-PnHMA is formed in a guide pattern of a hydrophilic resist, PS with the higher surface energy is likely to gather at the side wall of the resist. Therefore, an appropriate cylinder structure can be formed in the guide pattern of the resist. On the other hand, the contact angles with water of PnBMA, PnPMA, and PMMA are lower than that of PS. In other words, PnBMA, PnPMA, and PMMA have larger surface energies than PS.

Therefore, in the case where a resist is used as a guide pattern, PnBMA, PnPMA, and PMMA with high surface energies are likely to gather at the side wall of the resist, and an appropriate C/H pattern is not formed. Estimating from FIG. 6, poly(n-pentyl methacrylate) (the number of carbon atoms of the side chain being 5) has an approximately equal contact angle to PS. Therefore, the repulsive force between PS and poly(n-pentyl methacrylate) is low, and it is difficult for a copolymer of PS and poly(n-pentyl methacrylate) to produce phase separation. The relationship of the solubility parameter to the number of carbon atoms of the side chain of an acrylic is similarly reported in a past document (see Ruzette et al., Macromolecules 1998, 31, 8509-8516). Therefore, the number of carbon atoms of the side chain of the acrylic is preferably 6 or more.

Planar AFM (atomic force microscope) images of block copolymers actually phase-separated will now be illustrated.

FIG. 7A to FIG. 7F are AFM images illustrating phase separations in the pattern formation method according to the embodiment.

FIG. 7A to FIG. 7F illustrate planar AFM images of block copolymers immediately after application (the upper stage) and planar AFM images of the block copolymers after annealing treatment (the lower stage). In the AFM images, no physical guide is provided. That is, in these AFM images, it is checked whether or not a block copolymer layer containing two kinds of polymers A and B phase-separates into a layer containing the polymer A and a layer containing the polymer B at a prescribed temperature. The annealing time of them was set to 8 hours.

Figure 7F:
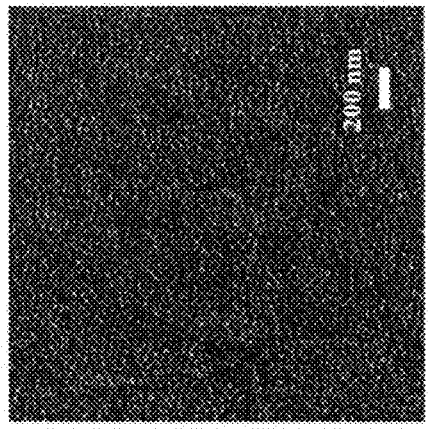
Figure 7F:
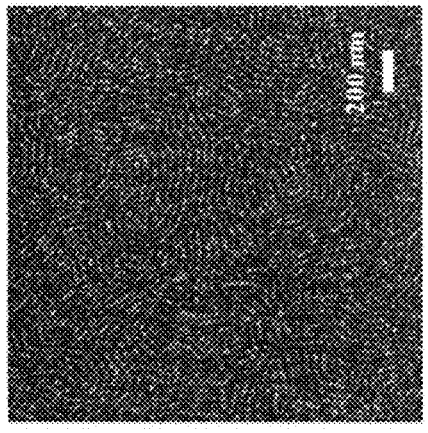
Figure 7E:
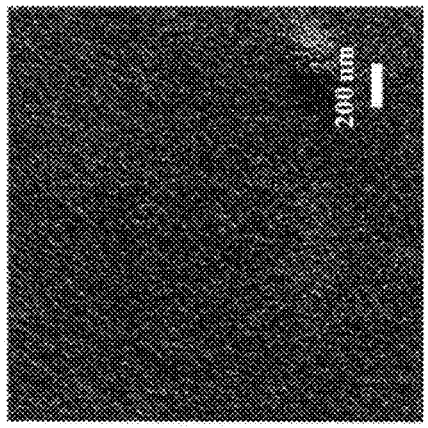
Figure 7E:
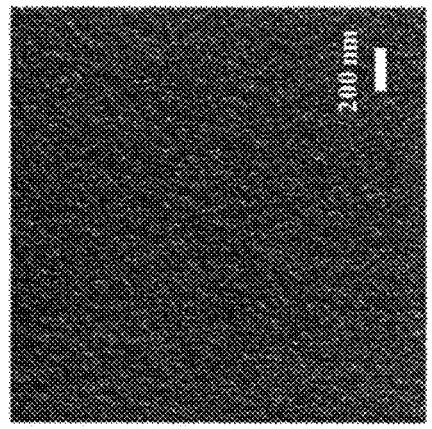
Figure 7D:
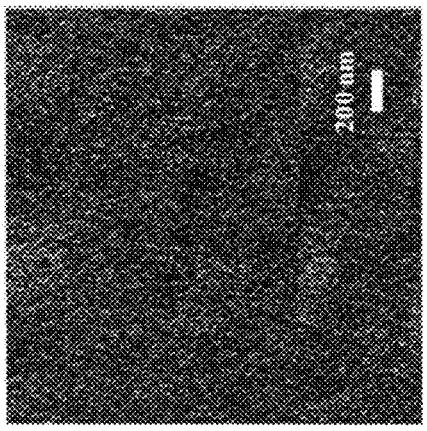
Figure 7D:
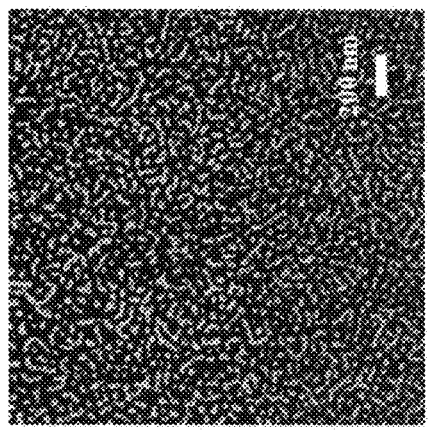

FIG. 7A and FIG. 7D illustrate planar AFM images of a PS-b-PMMA layer. In the PS-b-PMMA layer before annealing (FIG. 7A), no phase separation pattern appeared. A phase separation pattern appeared after annealing treatment at 160° C. (FIG. 7D).

FIG. 7B and FIG. 7E illustrate planar AFM images of a PS-b-PnBMA layer. No phase separation pattern appeared in the PS-b-PnBMA layer before annealing (FIG. 7B). No phase separation pattern appeared also after annealing treatment as shown in FIG. 7E. The annealing temperature is 180° C. Since a thermo-gravimetric analysis shows that PnBMA decomposes at 180° C. or more, the upper limit of the annealing temperature is 180° C. Thus, it has been found that the PS-b-PnBMA layer is less likely to phase-separate even at 180° C.

In contrast, FIG. 7C and FIG. 7F illustrate planar AFM images of a PS-b-PnHMA layer. As shown in FIG. 7C, in the PS-b-PnHMA layer, a phase separation pattern appeared even when annealing was not performed. A phase separation pattern was able to be found also in annealing treatment at 150° C. (FIG. 7F). It has been found that the PS-b-PnHMA layer sufficiently phase-separates at approximately 150° C. Thus, PS-b-PnHMA can reduce the annealing temperature as compared to PS-b-PMMA.

Figure 8:
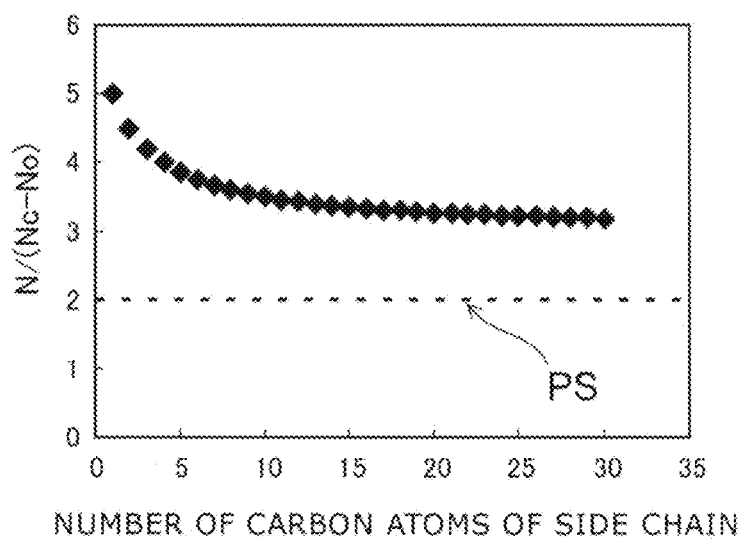
FIG. 8 is a graph illustrating a rule of thumb between the number of carbon atoms of the side chain of polystyrene and the dry etching resistance according to the embodiment.

FIG. 8 is a graph illustrating a rule of thumb between the number of carbon atoms of the side chain of polystyrene and the dry etching resistance according to the embodiment.

The horizontal axis is the number of carbon atoms of the side chain of polystyrene, and the vertical axis is the Ohnishi parameter ($N/(N_c-N_o)$), where N expresses the total number of atoms, $N_c$ expresses the number of carbon atoms, and $N_o$ expresses the number of oxygen atoms.

The Ohnish parameter expresses the density of carbon per unit polymerization volume, and the etching resistance generally increases as the Ohnishi parameter decreases.

As can be seen from FIG. 8, the dry etching resistance increases when the number of carbon atoms of the side chain is 6 to 18. As the number of carbon atoms of the side chain increases, steric hindrance becomes larger and it becomes more difficult to synthesize a polymer. Therefore, the number of carbon atoms of the side chain of the acrylic is preferably not less than 6 and not more than 18.

The dry etching resistance of PS is higher than the dry etching resistance of an acrylic. Thus, when dry etching processing is performed on a cylinder structure containing PS and an acrylic, the acrylic is selectively etching-removed.

In the embodiment, a block copolymer of a polystyrene derivative and an acrylic having 6 or more carbon atoms on the side chain is used. As the polystyrene derivative, polystyrene, polyhydroxystyrene, poly(2-vinylpyridine), and the like are given, for example. As the acrylic having 6 or more carbon atoms on the side chain, poly(n-hexyl methacrylate) (PnHMA), poly(n-heptyl methacrylate), poly(n-octyl methacrylate), poly(n-nonyl methacrylate), poly(n-decyl methacrylate), poly(n-undecyl methacrylate), poly(lauryl methacrylate) (PnLMA), poly(octadecyl methacrylate) (PnOMA), poly(n-hexyl acrylate), poly(n-heptyl acrylate), poly(n-octyl acrylate), poly(n-nonyl acrylate), poly(n-decyl acrylate), poly(n-undecyl acrylate), poly(lauryl acrylate), poly(n-octadecyl acrylate), and the like are given. Other than these, acrylics of similar chemical structures may be included to the extent that the number of carbon atoms of the side chain of the acrylics is 6 or more.

EXAMPLES

Examples will now be described.

Example 1

A photoresist for ArF exposure (AR2395 manufactured by JSR Corporation) is applied onto a Si substrate by spin coating under the conditions of 1500 rpm and 30 seconds. Subsequently, pre-bake is performed at 120° C. for 90 seconds, and then pattern exposure is performed with an ArF excimer laser using a reticle of a C/H pattern. The exposure amount is set to 25 mJ/cm$^2$. PEB (post-exposure bake) is performed at 125° C. for 60 seconds, and development is performed with 2.38% TMAH (tetramethylammonium hydroxide). Subsequently, entire surface exposure is performed on the photoresist after development with an ArF excimer laser. The exposure amount is set to 25 mJ/cm$^2$. Subsequently, the photoresist is cured by annealing at 185° C. for 120 seconds. By the entire surface exposure of the photoresist and the annealing, the photoresist is insolubilized in the block copolymer solution. Here, similar results are obtained also when the light source used for the entire surface exposure is replaced with a KrF excimer laser, a low pressure mercury lamp, or a high pressure mercury lamp. However, for the exposure amount of the low pressure mercury lamp and the high pressure mercury lamp, a value converted to that of a wavelength of 254 nm is used. In this way, a C/H pattern with a film thickness of the photoresist of 125 nm and an opening diameter of 70 nm (physical guide) is obtained.

Subsequently, a PS-b-PnHMA (polystyrene-poly(n-hexyl methacrylate) block copolymer) solution is prepared. Here, the weight average molecular weight of the PS-b-PnHMA used is 70,000, and the molar fraction (f(PS)) is 0.80. When the PS-b-PnHMA is phase-separated, PS forms a matrix phase, and PnHMA forms a cylinder phase with a diameter of 25 nm. A PS-b-PnHMA solution is obtained in which the PS-b-PnHMA is dissolved in PGMEA (propylene glycol 1-monomethyl ether 2-acetate) to be prepared in a concentration of 1.5 wt %. Next, the PS-b-PnHMA solution prepared is applied onto the photoresist fashioned in a C/H pattern by spin coating at 2000 rpm for 35 seconds. The film thickness of the PS-b-PnHMA layer in the physical guide is 80 nm. The resulting film is baked at 110° C. for 90 seconds to remove the solvent. Then, annealing is performed at 150° C. for 60 minutes in order to phase-separate the PS-b-PnHMA. Consequently, the PS-b-PnHMA forms a phase separation structure in the physical guide with a diameter of 70 nm. PS forms a matrix phase, and PnHMA forms a cylinder phase with a diameter of 25 nm.

After that, $O_2$ plasma etching is performed to selectively remove the cylinder phase formed of PnHMA. As a result of performing $O_2$ plasma etching until the surface of the Si substrate appears, a C/H pattern with a diameter of 25 nm can be formed. An observation of a cross section of the C/H pattern with a SEM (scanning electron microscope) shows that a C/H pattern with a height of 35 nm was able to be formed perpendicularly to the substrate surface. A C/H pattern with an aspect ratio of hole diameter/hole length=1/1.4 can be obtained.

Example 2

The case where wet etching is used as the method for selectively removing PS-b-PnHMA after phase separation will now be illustrated.

A photoresist for ArF exposure (AR2395 manufactured by JSR Corporation) is applied onto a Si substrate by spin coating under the conditions of 1500 rpm and 30 seconds. Subsequently, pre-bake is performed at 120° C. for 90 seconds, and then pattern exposure is performed with an ArF excimer laser using a reticle of a C/H pattern. The exposure amount is set to 25 mJ/cm². PEB is performed at 125° C. for 60 seconds, and development is performed with 2.38% TMAH. Subsequently, entire surface exposure is performed on the photoresist after development with an ArF excimer laser. The exposure amount is set to 25 mJ/cm². Subsequently, the photoresist is cured by annealing at 185° C. for 120 seconds. By the entire surface exposure of the photoresist and the annealing, the photoresist is insolubilized in the block copolymer solution. Here, similar results are obtained also when the light source used for the entire surface exposure is replaced with a KrF excimer laser, a low pressure mercury lamp, or a high pressure mercury lamp. However, for the exposure amount of the low pressure mercury lamp and the high pressure mercury lamp, a value converted to that of a wavelength of 254 nm is used. In this way, a C/H pattern with a film thickness of the photoresist of 125 nm and an opening diameter of 70 nm (physical guide) is obtained.

Subsequently, a PS-b-PnHMA solution is prepared. Here, the weight average molecular weight of the PS-b-PnHMA used is 70,000, and the molar fraction (f(PS)) is 0.80. When the PS-b-PnHMA is phase-separated, PS forms a matrix phase, and PnHMA forms a cylinder phase with a diameter of 25 nm. A PS-b-PnHMA solution is obtained in which the PS-b-PnHMA is dissolved in PGMEA to be prepared in a concentration of 1.5 wt %. Next, the PS-b-PnHMA solution prepared is applied onto the photoresist fashioned in a C/H pattern by spin coating at 2000 rpm for 35 seconds. The film thickness of the PS-b-PnHMA layer in the physical guide is 80 nm. The resulting film is baked at 110° C. for 90 seconds to remove the solvent. Then, annealing is performed at 150° C. for 60 minutes in order to phase-separate the PS-b-PnHMA. Consequently, the PS-b-PnHMA forms a phase separation structure in the physical guide with a diameter of 70 nm. PS forms a matrix phase, and PnHMA forms a cylinder phase with a diameter of 25 nm.

After that, the entire surface is irradiated with DUV (vacuum ultraviolet light) of a wavelength of 172 nm at 1800 mJ/cm². By the DUV irradiation, the PnHMA is decomposed. Similar results are obtained also when the light source is replaced with a KrF excimer laser, a low pressure mercury lamp, or a high pressure mercury lamp. Subsequently, development is performed for 30 seconds with a mixed solvent of methyl isobutyl ketone and 2-propanol in the ratio of 1:3. By the development, only the PnHMA decomposed is selectively removed. Thus, a C/H pattern with a diameter of 25 nm can be formed. Similar results are obtained also when butyl acetate, xylene, dibutyl ether, or toluene is used as the developer. An observation of a cross section of the C/H pattern with a SEM shows that a C/H pattern with a height of 75 nm was able to be formed perpendicularly to the substrate surface. Since the PS phase is not etched as in the case of $O_2$ plasma etching, a C/H pattern with a high aspect ratio (hole diameter/hole length=1/3) can be obtained.

Example 3

An SOC layer (film thickness: 150 nm) and an SOG layer (film thickness: 45 nm) are stacked in this order on a semiconductor circuit substrate composed of a W (tungsten) interconnection (interconnection width: 100 nm) at the uppermost layer and a TEOS film (film thickness: 150 nm) covering it. Spin coating is performed on the TEOS film using CT08 manufactured by JSR Corporation at 1500 rpm for 30 seconds to form an SOC layer. After that, spin coating is performed on the SOC using SOG080 manufactured by JSR Corporation at 1500 rpm for 30 seconds to form an SOG layer. Subsequently, a photoresist for ArF exposure (AR2395 manufactured by JSR Corporation) is applied onto the multiple-layer film by spin coating under the conditions of 1500 rpm and 30 seconds. Subsequently, pre-bake is performed at 120° C. for 90 seconds, and then pattern exposure is performed with an ArF excimer laser using a reticle of a C/H pattern. The exposure amount is set to 25 mJ/cm². PEB is performed at 125° C. for 60 seconds, and development is performed with 2.38% TMAH. Subsequently, entire surface exposure is performed on the photoresist after development with an ArF excimer laser. The exposure amount is set to 25 mJ/cm². Subsequently, the photoresist is cured by annealing at 185° C. for 120 seconds. By the entire surface exposure of the photoresist and the annealing, the photoresist is insolubilized in the block copolymer solution. Here, similar results are obtained also when the light source used for the entire surface exposure is replaced with a KrF excimer laser, a low pressure mercury lamp, or a high pressure mercury lamp. However, for the exposure amount of the low pressure mercury lamp and the high pressure mercury lamp, a value converted to that of a wavelength of 254 nm is used. In this way, a C/H pattern with a film thickness of the photoresist of 125 nm and an opening diameter of 70 nm (physical guide) is obtained.

Subsequently, a PS-b-PnHMA solution is prepared. Here, the weight average molecular weight of the PS-b-PnHMA used is 70,000, and the molar fraction (f(PS)) is 0.80. When the PS-b-PnHMA is phase-separated, PS forms a matrix phase, and PnHMA forms a cylinder phase with a diameter of 25 nm. A PS-b-PnHMA solution is obtained in which the PS-b-PnHMA is dissolved in PGMEA to be prepared in a concentration of 1.5 wt %. Next, the PS-b-PnHMA solution prepared is applied onto the photoresist fashioned in a C/H pattern by spin coating at 2000 rpm for 35 seconds. The film thickness of the PS-b-PnHMA layer in the physical guide is 80 nm. The resulting film is baked at 110° C. for 90 seconds to remove the solvent. Then, annealing is performed at 150° C. for 60 minutes in order to phase-separate the PS-b-PnHMA. Consequently, the PS-b-PnHMA forms a phase separation structure in the physical guide with a diameter of 70 nm. PS forms a matrix phase, and PnHMA forms a cylinder phase with a diameter of 25 nm.

After that, $O_2$ plasma etching is performed to selectively remove the cylinder phase formed of PnHMA. The $O_2$ plasma etching is performed until the surface of the SOG substrate appears. The physical guide of the photoresist and the matrix phase of PS are used as a mask to etch the SOG film with a fluorine-based gas. Subsequently, the pattern of the SOG is used as a mask to etch the SOC film with a $CF_4/O_2/Ar$-based gas. Finally, the pattern of the SOC is used as a mask to etch the TEOS film with a fluorine-based gas. Consequently, a C/H pattern with a diameter of 25 nm is formed on the W interconnection. An observation of a cross section of the C/H pattern with a SEM shows that a C/H pattern with a height of 80 nm was able to be formed perpendicularly to the surface of the W interconnection.

Example 4

The case where the block copolymer used is changed from PS-b-PnHMA to PS-b-PnOMA (a polystyrene-poly(octadecyl methacrylate) block copolymer) will now be illustrated.

A photoresist for ArF exposure (AR2395 manufactured by JSR Corporation) is applied onto a Si substrate by spin coating under the conditions of 1500 rpm and 30 seconds. Subsequently, pre-bake is performed at 120° C. for 90 seconds, and then pattern exposure is performed with an ArF excimer laser using a reticle of a C/H pattern. The exposure amount is set to 25 mJ/cm$^2$. PEB is performed at 125° C. for 60 seconds, and development is performed with 2.38% TMAH. Subsequently, entire surface exposure is performed on the photoresist after development with an ArF excimer laser. The exposure amount is set to 25 mJ/cm$^2$. Subsequently, the photoresist is cured by annealing at 185° C. for 120 seconds. By the entire surface exposure of the photoresist and the annealing, the photoresist is insolubilized in the block copolymer solution. Here, similar results are obtained also when the light source used for the entire surface exposure is replaced with a KrF excimer laser, a low pressure mercury lamp, or a high pressure mercury lamp. However, for the exposure amount of the low pressure mercury lamp and the high pressure mercury lamp, a value converted to that of a wavelength of 254 nm is used. In this way, a C/H pattern with a film thickness of the photoresist of 125 nm and an opening diameter of 70 nm (physical guide) is obtained.

Subsequently, a PS-b-PnOMA solution is prepared. Here, the weight average molecular weight of the PS-b-PnOMA used is 70,000, and the molar fraction (f(PS)) is 0.89. When the PS-b-PnOMA is phase-separated, PS forms a matrix phase, and PnOMA forms a cylinder phase with a diameter of 25 nm. A PS-b-PnOMA solution is obtained in which the PS-b-PnOMA is dissolved in PGMEA to be prepared in a concentration of 1.5 wt %. Next, the PS-b-PnOMA solution prepared is applied onto the photoresist fashioned in a C/H pattern by spin coating at 2500 rpm for 35 seconds. The film thickness of the PS-b-PnOMA layer in the physical guide is 80 nm. The resulting film is baked at 110° C. for 90 seconds to remove the solvent. Then, annealing is performed at 150° C. for 60 minutes in order to phase-separate the PS-b-PnOMA. Consequently, the PS-b-PnOMA forms a phase separation structure in the physical guide with a diameter of 70 nm. PS forms a matrix phase, and PnOMA forms a cylinder phase with a diameter of 25 nm.

After that, $O_2$ plasma etching is performed to selectively remove the cylinder phase formed of PnOMA. As a result of performing $O_2$ plasma etching until the surface of the Si substrate appears, a C/H pattern with a diameter of 25 nm can be formed. An observation of a cross section of the C/H pattern with a SEM shows that a C/H pattern with a height of 25 nm was able to be formed perpendicularly to the substrate surface.

Comparative Example 1

An example in which an appropriate C/H pattern like PS-b-PnHMA cannot be obtained when PS-b-PMMA is used as the block copolymer used will now be illustrated.

A photoresist for ArF exposure (AR2395 manufactured by JSR Corporation) is applied onto a Si substrate by spin coating under the conditions of 1500 rpm and 30 seconds. Subsequently, pre-bake is performed at 120° C. for 90 seconds, and then pattern exposure is performed with an ArF excimer laser using a reticle of a C/H pattern. The exposure amount is set to 25 mJ/cm$^2$. PEB is performed at 125° C. for 60 seconds, and development is performed with 2.38% TMAH.

Subsequently, entire surface exposure is performed on the photoresist after development with an ArF excimer laser. The exposure amount is set to 25 mJ/cm$^2$. Subsequently, the photoresist is cured by annealing at 185° C. for 120 seconds. By the entire surface exposure of the photoresist and the annealing, the photoresist is insolubilized in the block copolymer solution. In this way, a C/H pattern with a film thickness of the photoresist of 125 nm and an opening diameter of 70 nm (physical guide) is obtained.

Subsequently, a PS-b-PMMA solution is prepared. Here, the weight average molecular weight of the PS-b-PMMA used is 70,000, and the molar fraction (f(PS)) is 0.68. When the PS-b-PMMA is phase-separated, PS forms a matrix phase, and PMMA forms a cylinder phase with a diameter of 25 nm. A PS-b-PnHMA solution is obtained in which the PS-b-PMMA is dissolved in PGMEA to be prepared in a concentration of 1.5 wt %. Next, the PS-b-PMMA solution prepared is applied onto the photoresist fashioned in a C/H pattern by spin coating at 2000 rpm for 35 seconds. Bake is performed at 110° C. for 90 seconds, and then annealing is performed at 200° C. for 1 minute. Consequently, the PS-b-PMMA is phase-separated to form a cylinder structure with a diameter of 25 nm. After that, $O_2$ plasma etching is performed to selectively remove the PMMA phase. As a result, an appropriate C/H pattern is not obtained. This is because PMMA is more hydrophilic than PS as shown in FIG. 6 and gathers also at the side wall of the hydrophilic photoresist.

Comparative Example 2

An example in which a fine C/H pattern like PS-b-PnHMA cannot be obtained when PS-b-PnBMA is used as the block copolymer used will now be illustrated.

A photoresist for ArF exposure (AR2395 manufactured by JSR Corporation) is applied onto a Si substrate by spin coating under the conditions of 1500 rpm and 30 seconds. Subsequently, pre-bake is performed at 120° C. for 90 seconds, and then pattern exposure is performed with an ArF excimer laser using a reticle of a C/H pattern. The exposure amount is set to 25 mJ/cm². PEB is performed at 125° C. for 60 seconds, and development is performed with 2.38% TMAH. Subsequently, entire surface exposure is performed on the photoresist after development with an ArF excimer laser. The exposure amount is set to 25 mJ/cm². Subsequently, the photoresist is cured by annealing at 185° C. for 120 seconds. By the entire surface exposure of the photoresist and the annealing, the photoresist is insolubilized in the block copolymer solution. In this way, a C/H pattern with a film thickness of the photoresist of 125 nm and an opening diameter of 70 nm (physical guide) is obtained.

Subsequently, a PS-b-PnBMA solution separately prepared is applied onto the photoresist fashioned in a C/H pattern. Here, the weight average molecular weight of the PS-b-PnBMA used is 70,000, and the molar fraction (f(PS)) is 0.76. Bake is performed at 110° C. for 90 seconds, and then annealing is performed at 180° C. for 60 minutes. However, the PS-b-PnBMA cannot form a cylinder structure. Thus, a finer C/H pattern than the physical guide cannot be formed in the end. This is because the contact angle of PnBMA is approximately equal to that of PS (the surface energies of PS and PnBMA are approximately equal) as shown in FIG. 6, and therefore the repulsive force between PS and PnBMA is small and it is difficult for the PS-b-PnBMA to form a phase separation structure. This can be seen also from the results of AFM of FIGS. 7A to 7F.

By the embodiment, a resist can be utilized as a guide pattern by using a block copolymer composed of a polystyrene derivative and an acrylic having 6 or more carbon atoms on the side chain; thus, the number of processes can be reduced. Furthermore, since the phase separation annealing temperature can be reduced, a method for forming a fine C/H pattern at low cost and a block copolymer used for the pattern formation can be provided.

Hereinabove, embodiments of the invention are described with reference to specific examples. However, the invention is not limited to these specific examples. For example, one skilled in the art may appropriately select specific configurations of components used for pattern formation methods such as various layers, films, solids, liquids, and gases from known art and similarly practice the invention. Such practice is included in the scope of the invention to the extent that similar effects thereto are obtained.

Furthermore, not less than two components included in the above embodiments can be combined as long as technically feasible. Such combinations are also encompassed within the scope of the embodiments as long as they include the features of the embodiments.

In addition, those skilled in the art could conceive various modifications and variations within the spirit of the embodiments basing on above pattern formation methods. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A pattern formation method comprising:
forming a block copolymer layer in an opening of a resist layer provided on an underlayer, the underlayer includes a third layer containing a silicon compound, a film to be processed provided under the third layer, and an organic film between the third layer and the film to be processed, the block copolymer layer containing a polystyrene derivative and an acrylic, and the acrylic having 6 or more carbon atoms on a side chain;
forming a first layer containing the polystyrene derivative and a second layer containing the acrylic in the opening by phase-separating the block copolymer layer;
removing the second layer;
etching the third layer by using the resist layer and the first layer as a mask; and
etching the organic film by using the third layer as a mask.

2. The method according to claim 1, wherein the forming the first layer and the second layer includes forming a cylinder structure including the first layer and the second layer in the opening.

3. The method according to claim 1, wherein the polystyrene derivative includes polystyrene and the acrylic includes poly(hexyl methacrylate).

4. The method according to claim 1, wherein the polystyrene derivative is one of polystyrene, polyhydroxystyrene, and poly(2-vinylpyridine).

5. The method according to claim 1, wherein the acrylic is one of poly(n-hexyl methacrylate) (PnHMA), poly(n-heptyl methacrylate), poly(n-octyl methacrylate), poly(n-nonyl methacrylate), poly(n-decyl methacrylate), poly(n-undecyl methacrylate), poly(lauryl methacrylate) (PnLMA), poly(octadecyl methacrylate) (PnOMA), poly(n-hexyl acrylate), poly(n-heptyl acrylate), poly(n-octyl acrylate), poly(n-nonyl acrylate), poly(n-decyl acrylate), poly(n-undecyl acrylate), poly(lauryl acrylate), and poly(n-octadecyl acrylate).

6. The method according to claim 1, further comprising forming the resist layer before forming the block copolymer layer,
the forming the resist layer including cross-linking the resist layer to insolubilize the resist layer in a solvent for dissolving the block copolymer layer after the opening being formed in the resist layer.

7. The method according to claim 6, wherein the solvent is at least one selected from the group consisting of toluene, xylene, mesitylene, cyclohexanone, acetone, ethyl methyl ketone, methyl isobutyl ketone, methyl Cellosolve™, methyl Cellosolve™ acetate, ethyl Cellosolve™ acetate, butyl Cellosolve™ acetate, tetrahydrofuran, and chloroform.

8. The method according to claim 1,
further comprising:
etching the film to be processed provided under the organic film to form a pattern of the etched film to be processed by using the etched organic film as a mask.

9. A block copolymer used for a block copolymer layer for a pattern formation method,
the method including forming the block copolymer layer in an opening of a resist layer provided on an underlayer, the underlayer including a third layer containing a silicon compound, a film to be processed provided under the third layer, and an organic film between the third layer and the film to be processed, the block copolymer layer containing a polystyrene derivative and an acrylic, and the acrylic having 6 or more carbon atoms on a side chain, forming a first layer containing the polystyrene derivative and a second layer containing the acrylic in the opening by phase-separating the block copolymer layer, removing the second layer, etching the third layer by using the resist layer and the first layer as a mask, and etching the organic film by using the third layer as a mask.

10. The block copolymer according to claim 9, wherein the forming the first layer and the second layer includes forming a cylinder structure including the first layer and the second layer in the opening.

11. The block copolymer according to claim 9, wherein a volume fraction of the polystyrene derivative and a volume fraction of the acrylic are different.

12. The block copolymer according to claim 9, wherein the polystyrene derivative includes polystyrene and the acrylic includes poly(hexyl methacrylate).

13. The block copolymer according to claim 9, wherein the acrylic is one of poly(n-hexyl methacrylate) (PnHMA), poly(n-heptyl methacrylate), poly(n-octyl methacrylate), poly(n-nonyl methacrylate), poly(n-decyl methacrylate), poly(n-undecyl methacrylate), poly(lauryl methacrylate) (PnLMA), poly(octadecyl methacrylate) (PnOMA), poly(n-hexyl acrylate), poly(n-heptyl acrylate), poly(n-octyl acrylate), poly(n-nonyl acrylate), poly(n-decyl acrylate), poly(n-undecyl acrylate), poly(lauryl acrylate), and poly(n-octadecyl acrylate).

14. A pattern formation method comprising:
    forming a block copolymer layer in an opening of a resist layer provided on an underlayer, the block copolymer layer containing a polystyrene derivative and an acrylic;
    forming a first layer containing the polystyrene derivative and a second layer containing the acrylic in the opening by phase-separating the block copolymer layer;
    removing the second layer,
    the acrylic being one of poly(n-heptyl methacrylate), poly(n-octyl methacrylate), poly(n-nonyl methacrylate), poly(n-decyl methacrylate), poly(n-undecyl methacrylate), poly(lauryl methacrylate) (PnLMA), poly(octadecyl methacrylate) (PnOMA), poly(n-heptyl acrylate), poly(n-octyl acrylate), poly(n-nonyl acrylate), poly(n-decyl acrylate), poly(n-undecyl acrylate), poly(lauryl acrylate), and poly(n-octadecyl acrylate).

15. The method according to claim 14, wherein the forming the first layer and the second layer includes forming a cylinder structure including the first layer and the second layer in the opening.

16. The method according to claim 14, wherein the polystyrene derivative is one of polystyrene, polyhydroxystyrene, and poly(2-vinylpyridine).

17. The method according to claim 14, further comprising: forming the resist layer before forming the block copolymer layer,
    the forming the resist layer including cross-linking the resist layer to insolubilize the resist layer in a solvent for dissolving the block copolymer layer after the opening being formed in the resist layer.

18. The method according to claim 14, wherein
    the underlayer includes a third layer containing a silicon compound and a film to be processed provided under the third layer and
    the method further comprises:
    etching the third layer by using the resist layer and the first layer as a mask; and
    etching the film to be processed provided under the third layer to form a pattern of the etched film to be processed by using the etched third layer as a mask.

19. The method according to claim 14, wherein
    the underlayer includes a third layer containing a silicon compound and a film to be processed provided under the third layer and
    the method further comprises:
    forming an organic film between the third layer and the film to be processed;
    etching the third layer by using the resist layer and the first layer as a mask; and
    etching the organic film by using the third layer as a mask.

* * * * *